United States Patent
Slavin

(10) Patent No.: US 6,330,579 B1
(45) Date of Patent: Dec. 11, 2001

(54) FIR FILTER BASED UPON SQUARING

(75) Inventor: Keith R. Slavin, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/641,490

(22) Filed: Aug. 18, 2000

Related U.S. Application Data

(62) Division of application No. 09/195,729, filed on Nov. 18, 1998, now Pat. No. 6,233,593.

(51) Int. Cl.[7] ............................................. G06F 17/10
(52) U.S. Cl. ................................. 708/300; 708/319
(58) Field of Search ............................ 364/300, 301, 364/303, 319, 313, 322

(56) References Cited

U.S. PATENT DOCUMENTS 5,500,811 * 3/1996 Corry ...................................... 708/319
5,561,616 * 10/1996 Slavin ...................................... 708/300

* cited by examiner

*Primary Examiner*—Chuong Dinh Ngo
(74) *Attorney, Agent, or Firm*—Francis I. Gray

(57) ABSTRACT

An improved FIR filter based upon squaring is used to self-determine a filter constant equal to the sum-of-squares of the filter coefficients. An input signal is forced to zero for T samples, where T is the number of accumulator cells in an accumulator stage, and at the end of such zero samples the output from the filter is latched as the filter constant for use in filtering the normal input signal. The FIR filter may also be placed in a co-processor mode, using a FIFO register between the input of the FIR filter and a processor bus. A CPU on the bus initiates the co-processor mode and loads data into the FIFO. When the FIFO has data the data is read out and input to the FIR filter. The output of the FIR filter is placed on the processor bus. To determine the values of the filter coefficients loaded in the FIR filter, the data loaded by the CPU is an impulse signal having T–1 zero samples before and after an impulse sample, the output for each sample representing one of the filter coefficients.

2 Claims, 1 Drawing Sheet

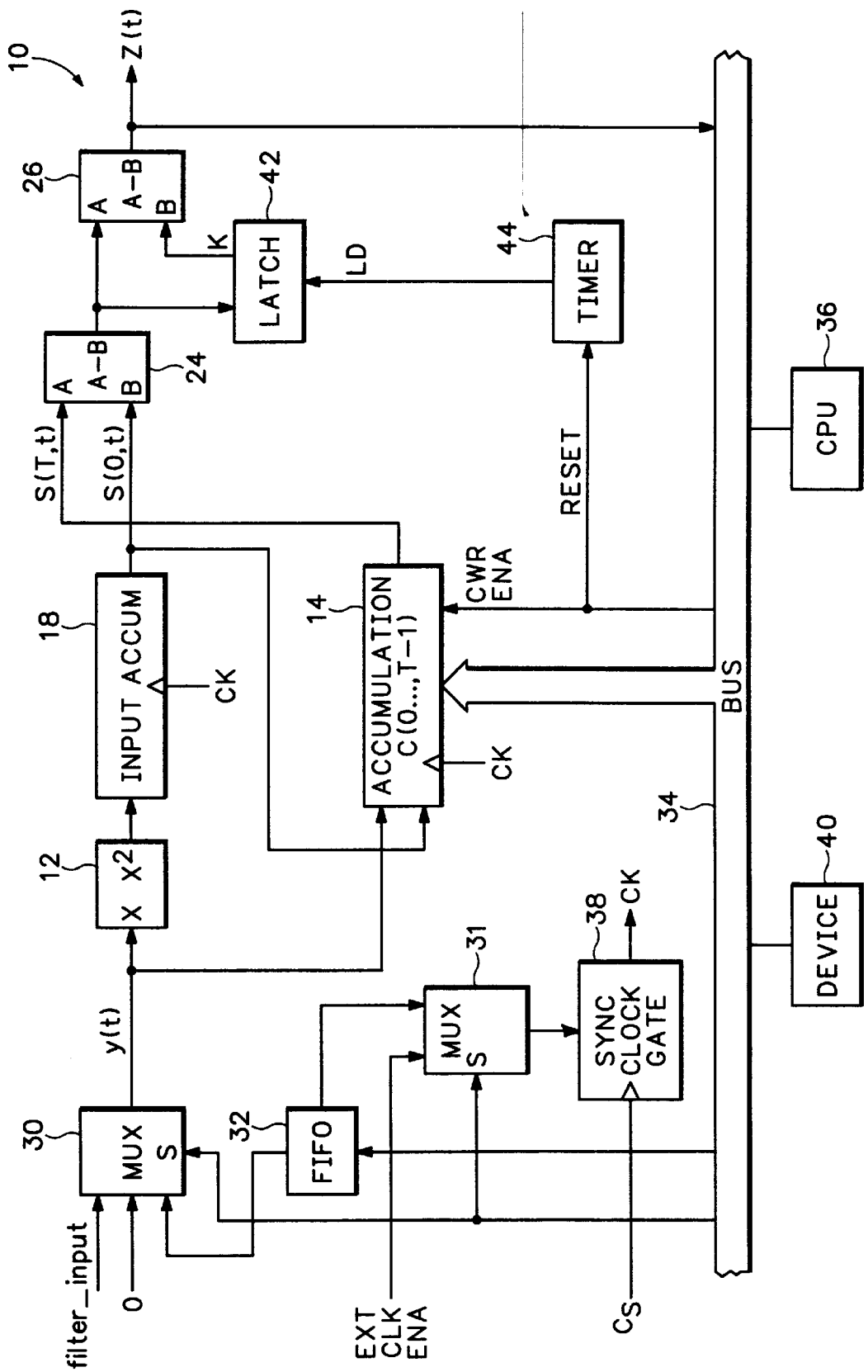

FIR FILTER BASED UPON SQUARING

This application is a divisional application of pending U.S. patent application Ser. No. 09/195,729 filed Nov. 18, 1998 now U.S. Pat. No. 6,233,593.

BACKGROUND OF THE INVENTION

The present invention relates to digital filtering of electronic signals, and more particularly to an improved finite impulse response (FIR) filter based upon squaring that uses the filter itself to determine a constant equal to the sum of the squares of the filter coefficients.

U.S. Pat. No. 5,561,616, issued to the present inventor on Oct. 1, 1996 entitled "FIR Filter Based Upon Squaring", illustrates a FIR filter based on squaring that reduces the complexity of the filter as opposed to standard FIR filter convolutions. At the output of the FIR filter is a subtracting circuit which has as one of the inputs a constant equal to the sum of the squares of the filter coefficients. The sum of the squares of the coefficients is indicated as being determined in a non-real-time manner with minimal hardware, by pre-calculation, or externally as an entry with each new set of coefficients as they are loaded.

Also once the set of coefficients is loaded into the filter, when the filter is coupled to a processor bus where multiple devices may access the filter, it is sometimes desirable to be able to determine what the coefficients of the filter are. A shadow set of values may be kept in a central processing unit (CPU) coupled to the bus from which the FIR filter was loaded, but this does not allow testing of the FIR filter by reading back the filter coefficients that were written. Or the coefficient inputs of the filter itself may be tied into a separate filter bus for reading back the filter coefficients, but this adds to the complexity of the FIR filter.

What is desired is an improved FIR filter based on squaring where the modification provides a way to easily determine the sum of the squares of the coefficients, while being accessible to external devices on a processor bus.

BRIEF SUMMARY OF THE INVENTION

Accordingly the present invention provides an improved FIR filter based on squaring that has the capability of computing the sum of the squares of the filter coefficients for use by the filter as well as providing the ability for an external device coupled to the bus to determine the coefficients currently loaded into the FIR filter. The input signal is forced to zero for T samples, where T is the number of accumulator stages, or taps, of the filter. At the end of T zero samples the output is latched to store the constant for use in the final subtraction stage of the filter. The filter may also be used as a co-processor by providing a FIFO interface with a CPU bus. The CPU, when it initiates the co-processor mode, disables the external input signal and itself clocks and loads data values into the FIFO. When the FIFO has data, then it is read out into the input of the filter as a data sample and a local filter clock is generated. The output of the filter is returned to the CPU via the bus. To determine what the loaded filter coefficients are, the data loaded into the FIFO by the external device is an impulse signal represented by T−1 zero samples both before and after an impulse sample. The outputs from the filter then represent each of the filter coefficients.

The objects, advantages and other novel features are apparent from the following detailed description when read in conjunction with the appended claims and attached drawing figures.

BRIEF DESCRIPTION OF THE SEVERAL VIEWS OF THE DRAWING

The FIGURE is a block diagram view of an improved FIR filter according to the present invention.

DETAILED DESCRIPTION OF THE INVENTION

Referring now to the FIGURE a multiplexer 30 is placed prior to an input squaring circuit 12 of a FIR filter 10 based on squaring. The multiplexer 30 has as inputs an external filter input signal, a zero signal and the output of a first-in, first-out (FIFO) register 32. The input of the FIFO 32 is coupled to a processor bus 34 to which also is coupled a central processing unit (CPU) 36. A synchronous clock gate circuit 38 has as an input a system clock $C_s$ and a clock gate from a second multiplexer 31 which selects between an external clock enable signal and a FIFO_has_data signal depending on a mode control input, and provides as an output a filter clock $C_k$. A mode control line is coupled between the bus 34 and the multiplexers 30, 31. Other devices 40 that access the FIR filter 10 may also be coupled to the bus 34.

The signal y(t) input to the FIR filter 10 via the multiplexer 30 is input to the input squaring circuit 12 and to accumulator stages 14, the output of the input squaring circuit being input to an input signal accumulator 18. The output from the input signal accumulator 18 is input to the accumulator stages 14 together with the input signal y(t) and the filter coefficients C(0. . . , T−1) which may be generated by the CPU 36 loaded via the bus 34. The outputs from the input signal accumulator 18 and the accumulator stages 14 are input to a first subtractor 24, the output of which is input to a second subtractor 26 and a latch 42. The output of the latch 42 is the second input to the substractor 26, the output of which provides the output signal z(t) that also is coupled to the bus 34. A timer 44 provides a load command to the latch 42, the timer being reset by a coefficient write command from the CPU 36 to the accumulation circuit 14.

A two-dimensional filter is conceptually a single one-dimensional filter with a large number of zero coefficients between non-zero regions corresponding to a serially scanned video frame structure and is usually constructed by inserting delays between groups of taps in the accumulation stages. In the FIR filter 10 of the present invention the accumulation path cannot be delayed between groups of paths, as this is effectively adding zero at each tap. If this is done, then:

$$(y(t)+C(T-n))^2=0$$

or y(t)=−C(T−n), obviously not true. To allow delays to be inserted, each group of taps must be regarded as a separate filter so that the square FIR filter equations $$z(t)=(S(T,t)-S(0,t)-K)/2$$

$$S(0,t)=S(0,t-1)+y(t)^2$$

are evaluated at the start and end of each group. The subtraction of K, where K=Sum(C(i)², (i,0,T−1)), is not required at an intermediate stage of the accumulation stages 14—the overall sum-of-squares of all the separate filter coefficients may be subtracted at one point at the end.

K may be most simply evaluated by observing that the sum-of-squares is independent of the input signal, and so K may be regarded as an unknown constant offset. z(t)=Sum (y(t−i)*C(i), (i,0, T−1)) generates a zero output at time t if $y(t-i)=0$ for all i from 0 to T−1. By not initially subtracting out K, forcing the input signal to zero implies that $S(T,t)-S(0,t)$ is the value of K at time t. This may be achieved in practice by circuitry that forces the y sample inputs to zero for T samples, where T is the number of stages in the accumulation stages 14, and then latching the value. If a sample state machine, which may be implemented by the CPU 36, represents discrete sample counts in a sequence with sample_count=0 at the start, then the formal description may be described:

```
        //sample_count state machine//
if coefficient_has_been_changed then
        sample_count <- 0       // start or restart sequence//
else
        if sample_count ≦ T then //increment to T+1 and stop//
           sample_count <- sample_count + 1
        endif
endif
```

What this outlines is that, when the coefficients for the FIR filter 10 are changed, then coefficient_has_been_changed is set to one and the sample_count is reset to zero. For each subsequent sample count coefficient_has_been_changed is at zero and the sample_count increments by 1 until the count is greater than T.

```
        //action based upon sample_count value//
if sample_count <T then
        y(t) = 0                        //force 0 into filter//
else
        y(t) = filter system_input      //normal filter operation//
        if sample_count == T then
           K <- S(T,t) - S(0,t)         //latch the value of K//
        endif
endif
```

The conditional "←" assignments are usually performed with a D-type flip-flop with input enable. In practice additional pipelining that delays the emergence of the results $S(T,t)-S(0,t)$ may require that the latch signal be delayed correspondingly. The timer 44 is designed to grab K at state T and stop at state T+1, which no longer forces the input y to zero and which subsequently generates the correct convolution output z(t). Any write of a new coefficient restarts the timer sequence again. This avoids having to read the stored coefficients to calculate K by a separate means, which also simplifies the circuit in each accumulation cell in the accumulation stages 14. Therefore as long as the sample_count is less than or equal to T, the control line to the multiplexer 30 selects the zero input for feeding into the FIR filter 10. When the sample_count is equivalent to T, then the output from the first subtractor 24 is captured in the latch 42 by the load signal from the timer 44 so that at T+1 the input y(t) to the FIR filter 10 is the external filter input signal and the second input to the second subtractor 26 is K from the latch.

The FIR filter 10 may work as a co-processor with the CPU by using the FIFO 32 between the bus 34 and the filter 10 input. In this mode the multiplexer 30 is placed in the co-processor mode by the mode control signal, and the FIR filter input is driven from the FIFO output while the local clock $C_k$ is only enabled by the synchronous clock gate 38 when the FIFO has data. In this way each write by the CPU 36 at a particular address forces a single data sample value into the FIFO 32 and allows the filter 10 to clock it in, which in turn empties the FIFO by one, so only a single filter clock is generated by each write.

The synchronous clock gate 38 may be implemented by a D-type flip-flop clocked by the system clock $C_s$, with the output of the multiplexer 31 as input and the local filter clock $C_k$ as output, the local filter clock being fed back through a delay to asynchronously clear the flip-flop and determine the local filter clock pulse width. In normal mode the external clock enable is applied to the flip-flop and the local filter clock is the system clock. In the co-processor mode the FIFO_has_data is applied to the flip-flop and the local filter clock is generated synchronous with the system clock only when the FIFO 32 has been loaded by the CPU 36 with data.

The output of the filter z(t) is provided on the bus 34 so that the CPU 36 may read the filter output before writing the next data sample to the FIFO 32. This allows rapid linear convolution to be performed within a software program by using the squaring FIR filter 10 as a co-processor. It also allows the use of a system clock (FIFO read clock) at a different frequency from the CPU clock (FIFO write clock) as long as the FIFO can transfer data between its asynchronously related read and write clocks. Thus the FIR filter 10 may be used for realtime convolution applications independently of the CPU clock when not in the co-processor mode. More formally

```
        //FIFO write clock domain//
FIFO_input = CPU_data_bus
if FIFO_write_from_CPU then
   write_into_FIFO()                    //affects FIFO_has_data//
endif
        //FIFO read clock (filter clock) domain//
if coprocessor_mode then
        if FIFO_has_data then
           read_from_FIFO()             //affects FIFO_has_data//
        endif
        filter_system_input = FIFO_output
        filter_clock_enable = FIFO_has_data
else
        filter_system_input = external_sample_input //y(t)//
        filter_clock_enable = external_clock_enable   //C_k//
endif
```

As a practical application this may be used to read back coefficients once programmed to help diagnose hardware problems. If no such mechanism is provided, then indirect read back of coefficients may, as for any linear convolution system, be provided by an external CPU by using the co-processor feature to inject an isolated impulse at some time t, isolated in the sense that each impulse is surrounded by at least T−1 samples of zero value on either side, and then observing the outputs which are:

$$\text{Output}(t+i)=C(i)*y\_\text{impulse}(t),\ 0\leq i<T$$

The T output values may be divided by the impulse size to obtain each of the T coefficient values C(i), providing the coefficient read back capability.

Thus the present invention provides an improved FIR filter based on squaring that self-determined a constant equal to the sum-of-squares of the filter coefficients by forcing the input signal to zero for T samples, where T equals the number of accumulator cells in the accumulator stage, and latching the result after T samples as the constant, which filter may also be used as a co-processor to determine what filter coefficients are loaded into the filter by inserting a FIFO between a CPU bus and the input to the filter for loading data from the CPU into the filter, the data being in the form of an impulse signal to determine the filter coefficients.

What is claimed is:

1. A method of using a FIR filter having T accumulation stages as a co-processor comprising the steps of:

loading data from a CPU via a CPU bus into a FIFO register coupled between the CPU bus and the input to the FIR filter;

reading the data from the FIFO register into the FIR filter;

generating a local filter clock for the FIR filter from a system clock when the FIFO register has data; and monitoring with the CPU via the CPU bus the output of the FIR filter generated by the data read into the FIR filter from the FIFO register.

2. The method as recited in claim 1 wherein the data comprises an impulse signal having at least T-1 zero samples preceding and succeeding an impulse sample, and the outputs represent the coefficients of the FIR filter.

* * * * *